(12) United States Patent
Wang et al.

(10) Patent No.: US 7,897,506 B2
(45) Date of Patent: Mar. 1, 2011

(54) MICRO-ELECTRO-MECHANICAL-SYSTEM DEVICE WITH PARTICLES BLOCKING FUNCTION AND METHOD FOR MAKING SAME

(75) Inventors: Chuan Wei Wang, HsinChu (TW); Sheng Ta Lee, HsinChu (TW)

(73) Assignee: PixArt Imaging Incorporation, R.O.C., Hsin-Chu (TW)

( * ) Notice: Subject to any disclaimer, the term of this patent is extended or adjusted under 35 U.S.C. 154(b) by 107 days.

(21) Appl. No.: 12/337,614

(22) Filed: Dec. 17, 2008

(65) Prior Publication Data

US 2010/0148321 A1    Jun. 17, 2010

(51) Int. Cl.
*H01L 21/764* (2006.01)
(52) U.S. Cl. .................. 438/624; 257/522
(58) Field of Classification Search ............ 257/522; 438/624
See application file for complete search history.

(56) References Cited

U.S. PATENT DOCUMENTS

2008/0074725 A1 *   3/2008   Pan ........................ 359/291

FOREIGN PATENT DOCUMENTS

WO    WO 2007022978 A1 *   3/2007

OTHER PUBLICATIONS

TESS report. on "Black diamond" performed May 31, 2010.*
IEEE MEMS 2008, Tucson. AZ, USA, Jan. 13-17, 2008 pp. 798-801.
2001 IEEE Publication pp. 352-357.

* cited by examiner

*Primary Examiner*—Thomas L Dickey
(74) *Attorney, Agent, or Firm*—Tung & Associates

(57) ABSTRACT

The present invention discloses a MEMS device with particles blocking function, and a method for making the MEMS device. The MEMS device comprises: a substrate on which is formed a MEMS device region; and a particles blocking layer deposited on the substrate.

2 Claims, 4 Drawing Sheets

MICRO-ELECTRO-MECHANICAL-SYSTEM DEVICE WITH PARTICLES BLOCKING FUNCTION AND METHOD FOR MAKING SAME

BACKGROUND

1. Field of Invention

The present invention relates to a micro-electro-mechanical system (MEMS) device and a method for making the MEMS device, in particular to a MEMS device with particles blocking function and a method for making it.

2. Description of Related Art

MEMS devices are used in a wide variety of products such as micro-acoustical sensor, gyro-sensor, accelerometer, etc. A MEMS device usually has a mechanical structure part located on top of the overall device, and therefore if particles fall into the device, the operation of the mechanical structure may be adversely affected. Thus, it is desired to provide a MEMS device with particles blocking function.

SUMMARY OF THE INVENTION

It is an objective of the present invention to provide a MEMS device with particles blocking function.

It is another objective of the present invention to provide a method for making a MEMS device with particles blocking function, which is fully compatible with a standard CMOS manufacturing process.

In accordance with the foregoing and other objectives of the present invention, from one aspect, the present invention discloses a MEMS device with particles blocking function, comprising: a substrate on which is formed a MEMS device region; and a particles blocking layer deposited on the substrate.

In another aspect, the present invention discloses a method for making a MEMS device with particles blocking function, comprising: providing a substrate; forming a MEMS device region on the substrate; and depositing a particles blocking layer for blocking particles.

The particles blocking layer in the above-mentioned MEMS device and method is preferably made of a porous material.

A preferred material for the particles blocking layer is a material referred to as Black Diamond in the semiconductor industry.

It is to be understood that both the foregoing general description and the following detailed description are provided as examples, for illustration and not for limiting the scope of the invention.

BRIEF DESCRIPTION OF THE DRAWINGS

These and other features, aspects, and advantages of the present invention will become better understood with regard to the following description, appended claims, and accompanying drawings.

DESCRIPTION OF THE PREFERRED EMBODIMENTS

The drawings as referred to throughout the description of the present invention are for illustration only, but not drawn according to actual scale.

Figure 1A:
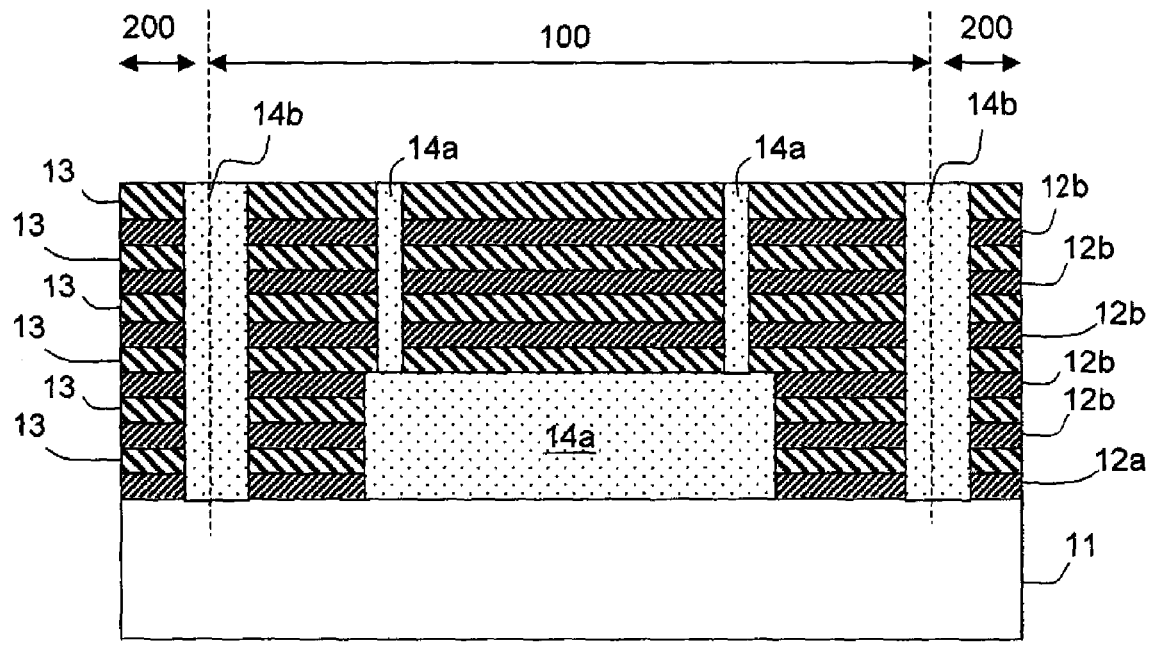
FIGS. 1A-1D show an embodiment according to the present invention.

Referring to FIG. 1A for the first embodiment of the present invention, a zero-layer wafer substrate 11 is provided, which for example can be a silicon wafer so that the process is compatible with a standard CMOS process. Next, transistor devices can be formed by standard CMOS process steps as required (not shown), followed by deposition, lithography and etch steps to form interconnection including a contact layer 12a, metal layers 13, and via layers 12b. In one embodiment, the contact layer and the via layers can be made of tungsten; the metal layers can be made of aluminum; and the dielectric layer can be made of oxides such as silicon dioxide. Other conductive or dielectric materials can be used to replace what are suggested above, and the structure can include more or less number of metal layers. The pattern of each of the layers 12a, 12b and 13 is thus that a sacrificial region 14a and an isolation region 14b are formed therein. The detailed pattern of each layer is not shown for simplicity of the drawings. The regions 14a and 14b may be made of the same or different materials; in this embodiment they are both made of an oxide, such as silicon dioxide. The sacrificial region 14a is provided so that the suspension structure of the MEMS device to be manufactured is separated from the silicon substrate (also referring to FIG. 1D). The isolation region 14b is provided to isolate the MEMS device region 100 from the other circuit region 200; its cross sectional pattern need not be exactly as shown but can be of any other shape.

Figure 1B:
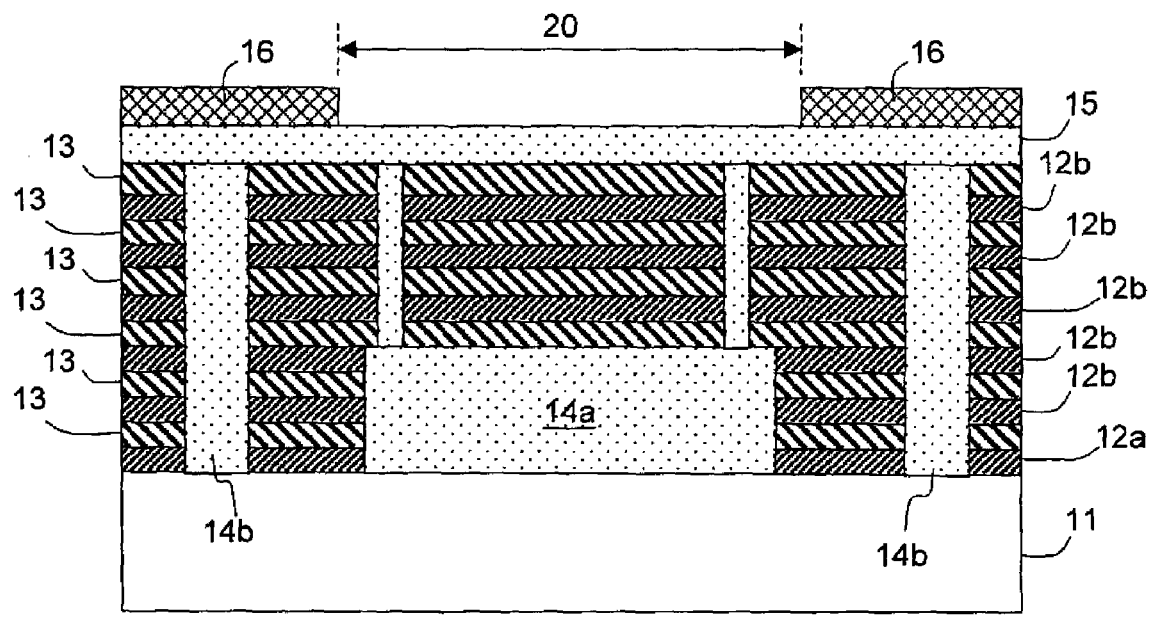

Referring to FIG. 1B, a passivation layer 15 is formed on the substrate. The passivation layer may be a single or composite layer, such as an oxide layer, a nitride layer or a bi-layer structure including an oxide layer and a nitride layer. Next, a mask layer 16 is deposited on the substrate and patterned to open an area 20 so that an etch step can take place later through the opened area 20. The mask layer 16 may be made of a material such as poly-silicon, amorphous-silicon, or metal.

Figure 1C:
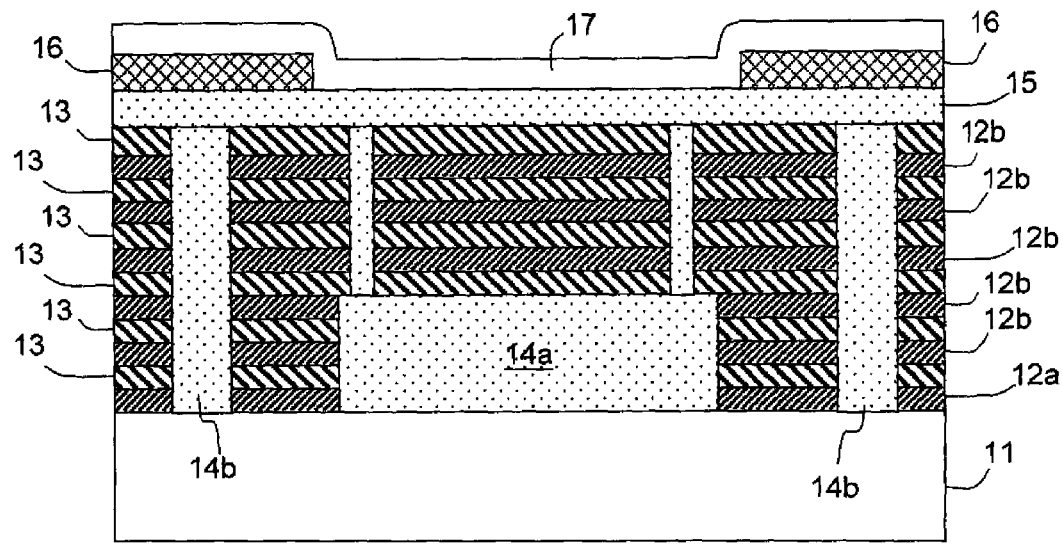

Referring to FIG. 1C, a particles blocking layer 17 is deposited on the substrate. The particles blocking layer 17 prevents particles from falling into the MEMS device after the MEMS device is finished. Preferably, the particles blocking layer 17 is made of a porous material so that the oxide in the sacrificial region 14a can be better removed in a later etch step.

Figure 1D:
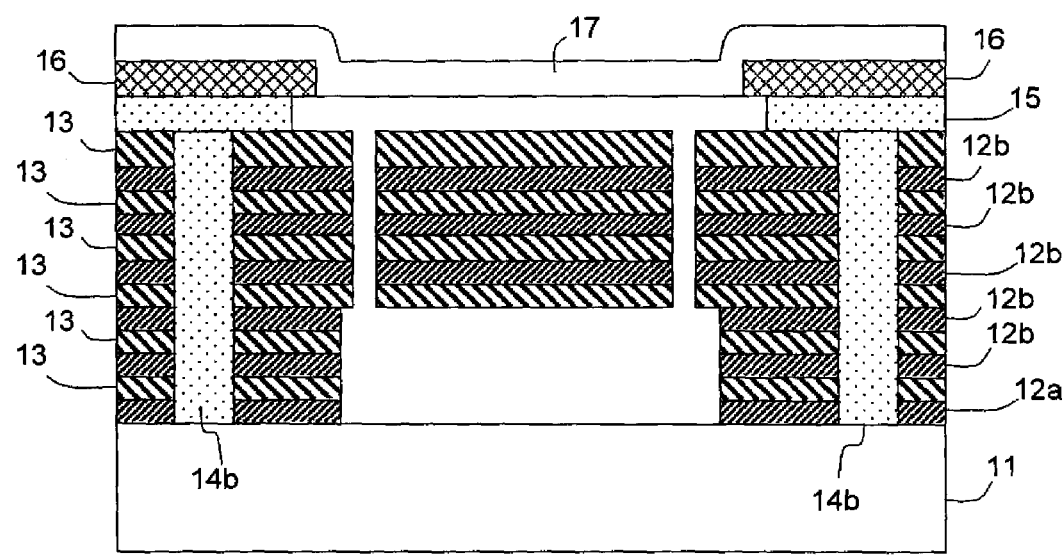

Referring to FIG. 1D, an etch step is performed to remove the oxide in the sacrificial region 14a. The etch for example can be HF (hydrogen fluoride) vapor etch. Thus, a desired MEMS device is formed; the MEMS device has a particles blocking function, preventing particles from falling into the mechanical structure of the MEMS device.

Figure 2A:
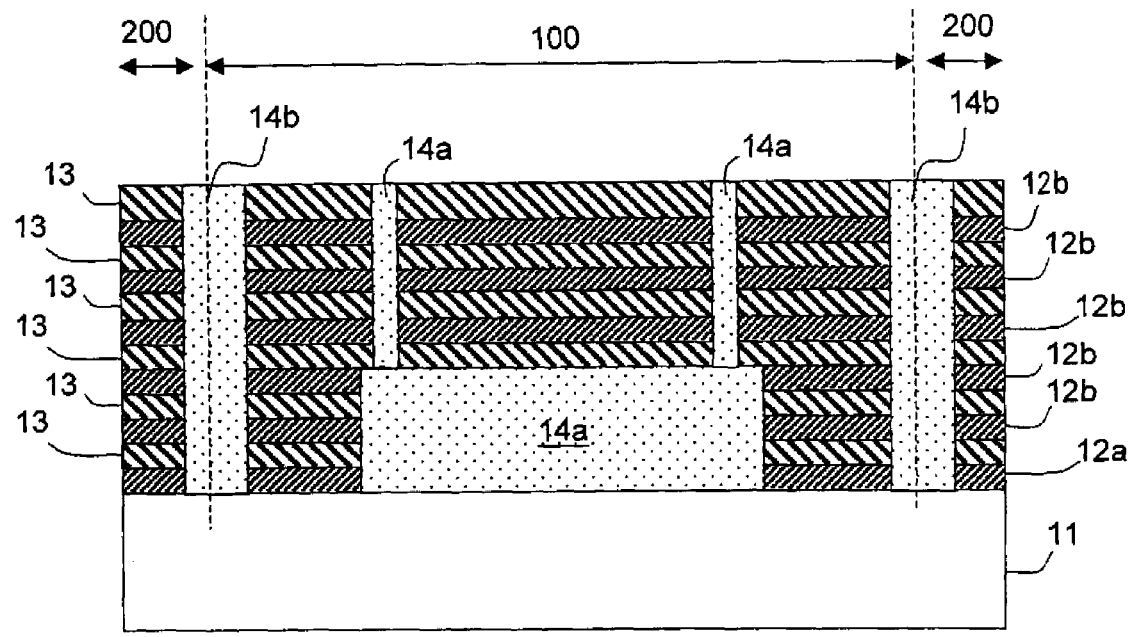
FIGS. 2A-2D show another embodiment according to the present invention.

In the method described above, the mask layer 16 and the particles blocking layer 17 can be formed in a reversed order. FIGS. 2A-2D show a second embodiment of the present invention to explain this. The description for FIG. 2A is omitted because it is the same as FIG. 1A.

Figure 2B:
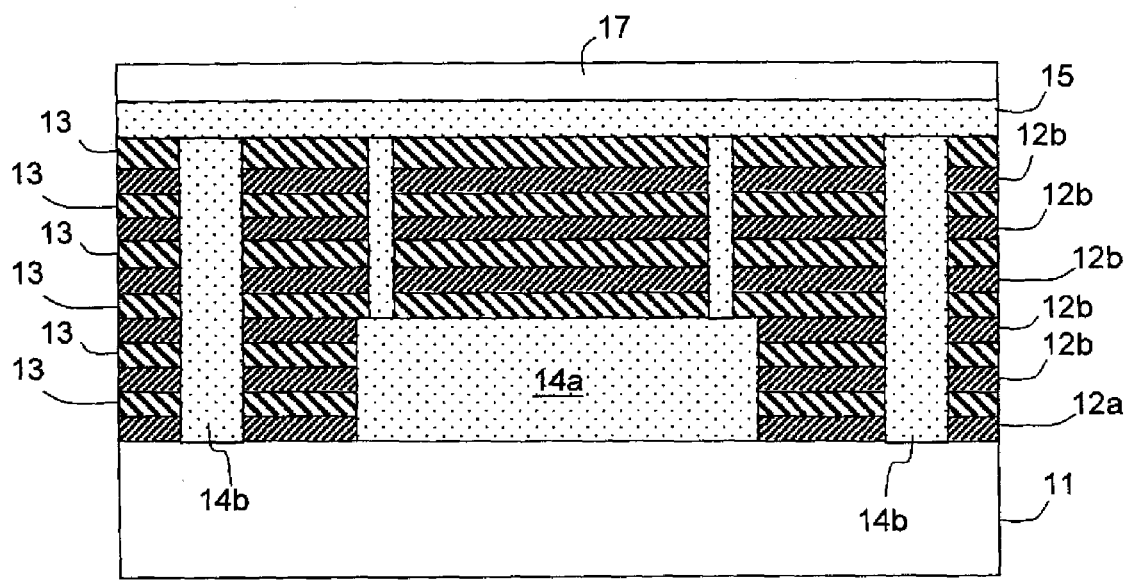

Referring to FIG. 2B, after FIG. 2A, a passivation layer 15 is formed on the substrate. As stated above, the passivation layer 15 may be a single or composite layer, such as an oxide layer, a nitride layer or a bi-layer structure including an oxide layer and a nitride layer. Next, a particles blocking layer 17 (not the mask layer 16 in the previous embodiment) is deposited on the substrate. The particles blocking layer 17 is preferably made of a porous material.

Figure 2C:
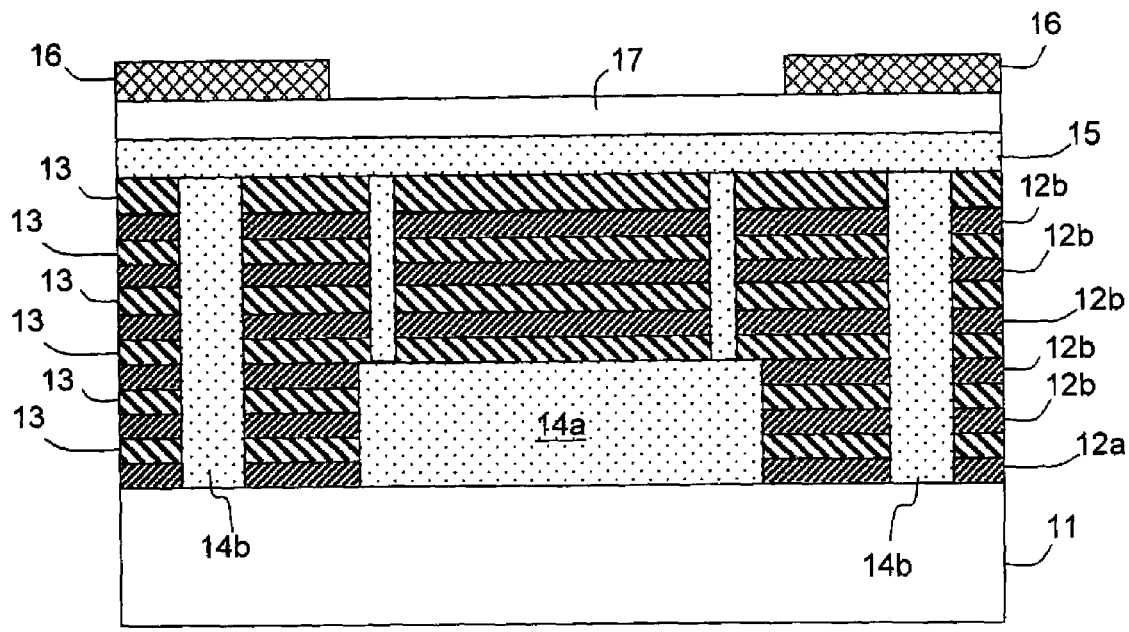

Referring to FIG. 2C, next a mask layer 16 is deposited on the substrate and patterned. The mask layer 16 may be made of a material such as poly-silicon, amorphous-silicon, or metal.

Figure 2D:
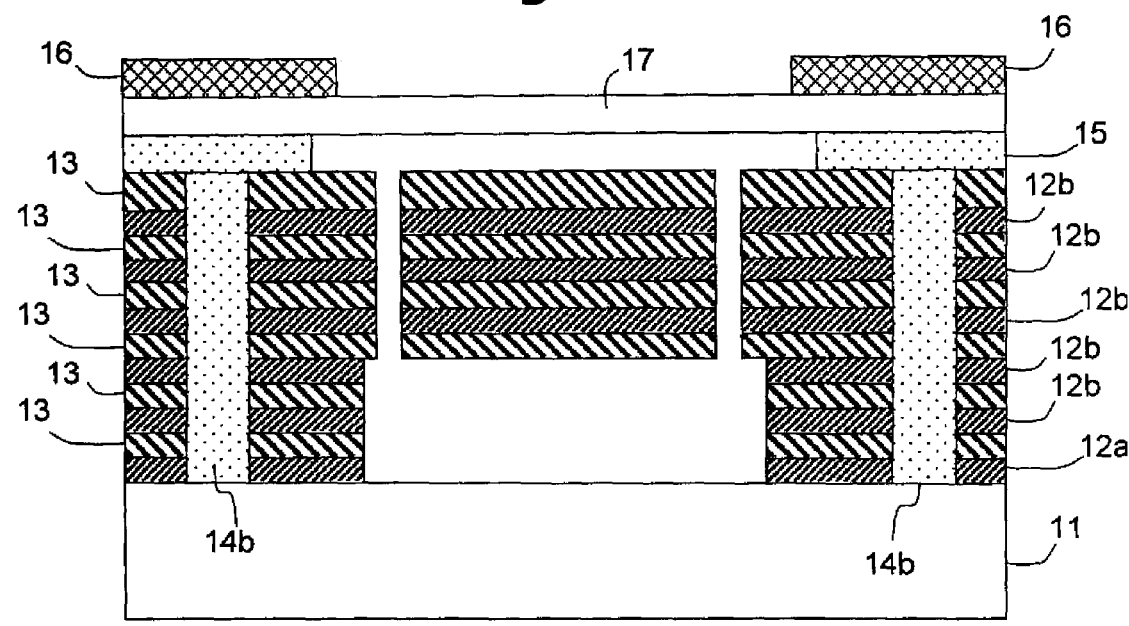

Referring to FIG. 2D, an etch step is performed to remove the oxide in the sacrificial region 14a. The etch for example can be HF (hydrogen fluoride) vapor etch. Thus, a desired MEMS device is formed; the MEMS device has a particles blocking function, preventing particles from falling into the mechanical structure of the MEMS device.

Although the present invention has been described in detail with reference to certain preferred embodiments thereof, the description is for illustrative purpose and not for limiting the scope of the invention. For example, the materials, number of metal layers, etch details, and so on, can be modified without departing from the spirit of the present invention. One skilled in this art can readily think of other modifications and variations in light of the teaching by the present invention. In view of the foregoing, it is intended that the present invention cover all such modifications and variations, which should interpreted to fall within the scope of the following claims and their equivalents.

What is claimed is:

1. A method for making a MEMS device with particles blocking function, comprising:
    providing a substrate;
    forming a MEMS device region on the substrate;
    depositing a particles blocking layer for blocking particles, wherein the particles blocking layer is made of a porous material which allows a vaporized etchant to pass through;
    depositing and patterning a mask layer to open an area, wherein the mask layer is located between the substrate and the particles blocking layer or above the particles blocking layer;
    providing an oxide layer between the MEMS device region and the particles blocking layer, and
    etching the oxide layer through the particles blocking layer and the mask layer, by the vaporized etchant.

2. The method of claim 1, wherein the vaporized etchant includes hydrogen fluoride vapor.

* * * * *